(12) United States Patent
Sasaki

(10) Patent No.: US 6,340,546 B1
(45) Date of Patent: Jan. 22, 2002

(54) POSITIVE PHOTOSENSITIVE RESIN COMPOSITION, METHOD OF FORMING RELIEF PATTERN, AND ELECTRONIC PART

(75) Inventor: Mamoru Sasaki, Hitachi (JP)

(73) Assignees: Hitachi Chemical Dupont Microsystems Ltd., Tokyo (JP); Hitachi Chemical Dupont Microsystems L.L.C., Wilmington, DE (US)

( * ) Notice: Subject to any disclaimer, the term of this patent is extended or adjusted under 35 U.S.C. 154(b) by 0 days.

(21) Appl. No.: 09/500,631

(22) Filed: Feb. 9, 2000

(30) Foreign Application Priority Data

Feb. 9, 1999 (JP) .............................. 11-031936

(51) Int. Cl.$^7$ .............................. G03F 7/023; G03F 7/30
(52) U.S. Cl. .......................... 430/18; 430/192; 430/193; 430/270.1; 430/326
(58) Field of Search .............................. 430/270.1, 192, 430/193, 326, 18

(56) References Cited

U.S. PATENT DOCUMENTS 5,302,489 A * 4/1994 Shu ............................ 430/191
5,348,835 A * 9/1994 Oba et al. .................... 430/192

FOREIGN PATENT DOCUMENTS

| EP | 0 436 457 | 7/1991 |
| EP | 0 863 436 | 9/1998 |
| JP | 03-115461 | 5/1991 |
| JP | 10-239844 | 9/1998 |

\* cited by examiner

Primary Examiner—John S. Chu
(74) Attorney, Agent, or Firm—Griffin & Szipl, P.C.

(57) ABSTRACT

Positive photosensitive resin compositions, which comprise (A) a polyamidate having repetitive units of general formula (I)

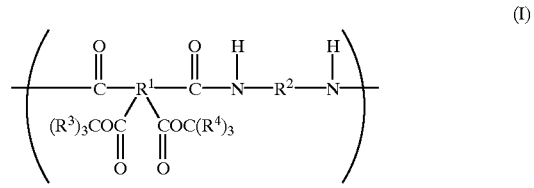

wherein $R^1$ is a tetravalent organic group, $R^2$ is a divalent organic group having a phenolic hydroxyl group, three $R^3$ groups and three $R^4$ groups each independently are an alkyl group or a hydrogen atom, and at least two $R^3$ groups and at least two $R^4$ groups are alkyl groups, and (B) a compound capable of generating an acid when exposed to light, are improved in storage stability and exposure sensitivity to i-line. Such compositions can improve the reliability of electronic parts when formed into surface-protecting films or interlayer insulating films by a method including exposure to i-line, development and heating.

14 Claims, 1 Drawing Sheet

POSITIVE PHOTOSENSITIVE RESIN COMPOSITION, METHOD OF FORMING RELIEF PATTERN, AND ELECTRONIC PART

This application claims prior of Japanese Patent Application No. 11-31936, filed Feb. 9, 1999, the entire disclosure of which is hereby incorporated by reference.

BACKGROUND OF THE INVENTION (a) Field of the Invention

The invention relates to positive photosensitive resin compositions, particularly to positive photosensitive resin compositions which, on heating, become heat-resistant polyimide polymers suitable for surface-protecting films, interlayer insulating films and others for electronic parts such as semiconductor elements. It also relates to methods of forming relief patterns and to electronic parts using such compositions.

(b) Description of the Related Art

Polyimides have good heat rsistance and good mechanical properties, and are readily formed into films of which the surface could be well planarized. Having those advantages, they are widely used for surface-protecting films, interlayer insulating films and others for semiconductor devices. Where polyimides are used for surface-protecting films or interlayer insulating films, forming through-holes and the like in such films is achieved mainly by etching processes using positive photo-resists. Such processes, however, involve steps of appying and removing the photo-resists, which complicate the processes. To simplify the working process, heat-resistant materials with photosensitivity have heretofore been studied.

As to photosensitive polyimide compositions, for example, known are (a) a polyimide precursor composition in which is introduced photosensitive groups through ester bonding (Japanese Patent Application Examined Publication No. 52-30207), and (b) a polyamidate composition in which is added a compound that has carbon-carbon double bonds capable of being dimerized or polymerized by the action of chemical rays, amino groups and an aromatic bisazide (Japanese Patent Application Examined Publication No. 3-36861). To form patterns, photosensitive polyimide precursor compositions are generally applied in solution form onto a substrate and dried, and then exposed to active rays via a mask and developed.

The compositions (a) and (b), however, require an organic solvent as a developer. When waste developers are treated, the large quantities of developers that are several times that of the photosensitive polyimide precursor compositions load the environment heavily. In recent years, for the preservation of the environment, there has been increasing demand for photosensitive polyimide compositions that are developable with aqueous developers and enable easy treatment of waste developers. Further, the compositions (a) and (b) are both negative ones, and involve the problem that the mask for exposure needs to be changed to switch from an etching process using positive photo-resists to the process using negative photosensitive polyimide precursors.

As to positive photosensitive polyimide precursor compositions, for example, known are (c) a polyimide precursor in which is introduced an o-nitrobenzyl group through ester bonding (Japanese Patent Application Unexamined Publication No. 60-37550), (d) a composition comprising a polyamidate and an o-quinonediazide compound (Japanese Patent Application Unexamined Publication No. 2-181149), (e) a composition comprising a carboxyl group-having polyamidate and an o-quinonediazide compound (Japanese Patent Application Unexamined Publication No. 4-168441), and (f) a composition comprising a hydroxyl group-having polyamidic acid or polyamidate and an o-quinonediazide compound (Japanese Patent Application Unexamined Publication No. 3-115461).

Incidentally, semiconductor elements have been increasingly integrated with years, requiring improved fine processing techniques. A means for enabling fine processing is exposure using light of shorter wavelength, and g-line (wavelength: 436 mn), which have been mainly used as the exposure light to pattern positive photo-resists, are being replaced by exposure to i-line (wavelength: 365 nm). Accordingly, photosensitive polyimide precursors are also required to be able to form patterns with i-line, to accommodate them to exposure apparatuses using i-line.

The positive photosensitive polyimide precursor composition (c), however, is sensitive mainly to lights of wavelengths of 300 nm or less, and has poor sensitivity to i-line. The positive photosensitive resin compositions (d) and (e) have the shortcoming of poor storage stability. The Japanese Patent Unexamined Publication No. 3-115461 does not disclose or suggest exposure with i-line, and the positive photosensitive resin composition (f) disclosed therein, in fact, has poor sensitivity to i-line.

SUMMARY OF THE INVENTION

An object of the invention is to solve the problems in the above-described prior art by providing a positive photosensitive resin composition which is highly sensitive to lights including i-line and has good storage stability.

Accordingly, the invention provides a positive photosensitive resin composition comprising:

(A) a polyamidate having repetitive units of general formula (I)

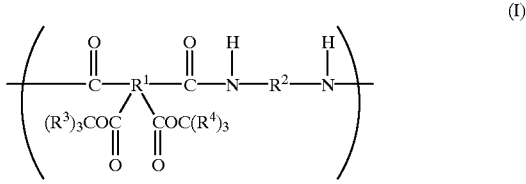

wherein $R^1$ is a tetravalent organic group, $R^2$ is a divalent organic group having a phenolic hydroxyl group, three $R^3$ groups and three $R^4$ groups each independently are an alkyl group or a hydrogen atom, and at least two $R^3$ groups and at least two $R^4$ groups are alkyl groups, and (B) a compound capable of generating an acid when exposed to light.

Another object of the present invention is to provide a positive photosensitive resin composition to be used for exposure with i-line.

Accordingly, in one embodiment, the positive photosensitive resin composition is to be exposed to i-line.

Another object of the present invention is to provide a positive photosensitive resin composition which further has good heat resistance.

Accordingly, in one embodiment, the group represented by $R^1$ is a tetravalent organic group which has a condensed polycyclic structure consisting of 2 to 5 benzene rings or a polycyclic structure wherein two or three aromatic rings are linked to each other through one or two bonds selected from the group consisting of a single bond, an ether bond (—O—), an isopropylidene bond (—C(CH$_3$)$_2$—), a hexafluoroisopropylidene bond (—C(CF$_3$)$_2$—), a sulfone bond (—SO$_2$—), a methylene bond (—CH$_2$—) and a carbonyl bond (—CO—), and the group represented by R$^2$ is a divalent organic group which has an aromatic ring or a polycyclic structure wherein two or three aromatic rings are linked to each other through one or two bonds selected from the group consisting of a single bond, an ether bond, an isopropylidene bond (—C(CH$_3$)$_2$—), a hexafluoroisopropylidene bond, a sulfone bond, a methylene bond and a carbonyl bond, and has at least one phenolic hydroxyl group.

In one embodiment, the tetravalent organic group represented by R$^1$ is selected from the group consisting of

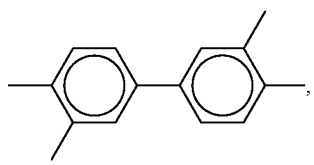,

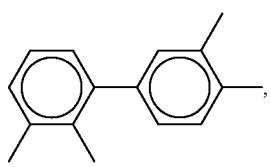,

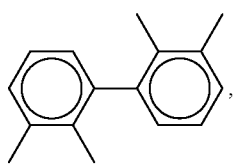,

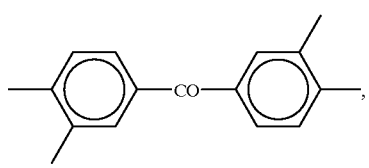,

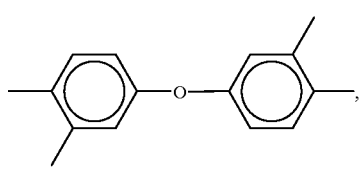,

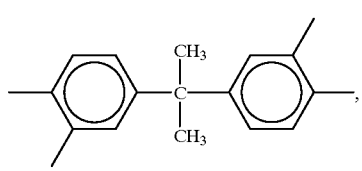,

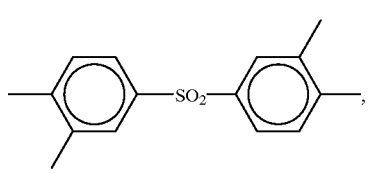,

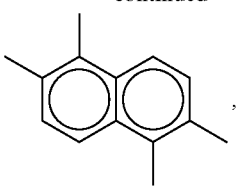,

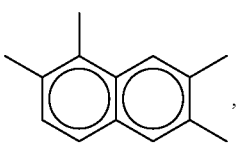,

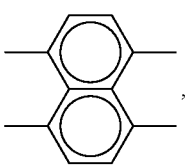,

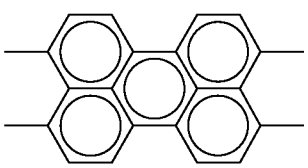,

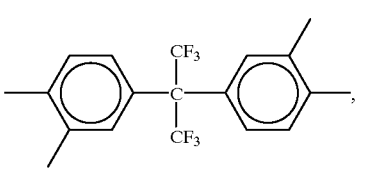 and

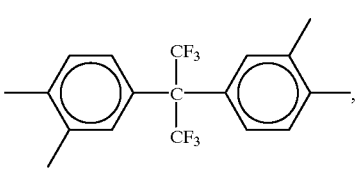, and the group —C(=O)OC(R$^3$)$_3$ is linked to R$^1$ at an ortho or peri position relative to one of the amide bonds, and the group —C(=O)OC(R$^4$)$_3$ is linked to R$^1$ at an ortho or peri position relative to the other amide bond;

and the divalent organic group represented by R$^2$ is selected from the group consisting of

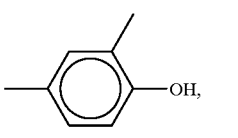  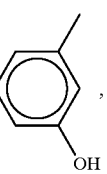

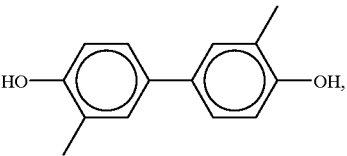,

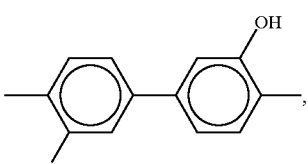,

-continued

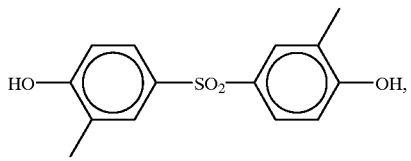

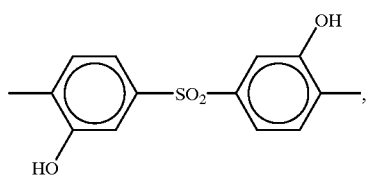

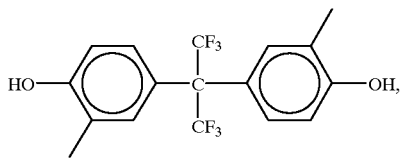

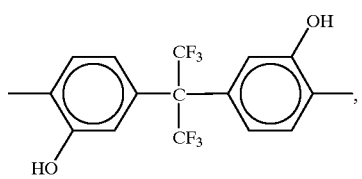

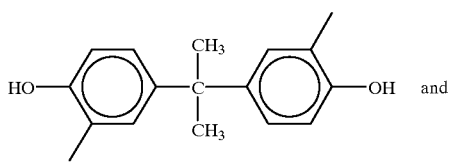

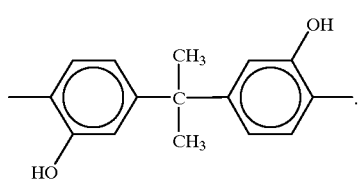

Another object of the invention is to provide a positive photosensitive resin composition which has good storage stability and is particularly highly sensitive to lights including i-line.

Accordingly, in one embodiment, the invention provides a positive photosensitive resin composition which comprises (A') a polyamidate having repetitive units of general formula (I')

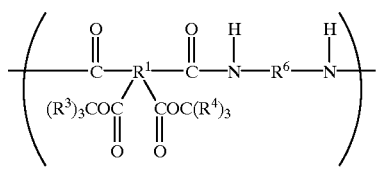

wherein $R^1$ is a tetravalent organic group, $R^6$ is a divalent organic group selected from three $R^3$ groups and three $R^4$ groups each independently are an alkyl group or a hydrogen atom, and at least two $R^3$ groups and at least two $R^4$ groups are alkyl groups, and (B) a compound capable of generating an acid when exposed to light.

Another object of the invention is to provide a positive photosensitive resin composition which is less shrinkable when heat-treated after development.

Accordingly, in one embodiment, the groups represented by $-C(R^3)_3$ and $-C(R^4)_3$ are isopropyl groups, sec-butyl groups or 1-methylbutyl groups.

Another object of the invention is to provide a positive photosensitive resin composition which is particularly sensitive to lights including i-line.

Accordingly, in one embodiment of the invention, the tetravalent organic group represented by $R^1$ is selected from the group consisting of

[structures]

In one embodiment, the component (B) is selected from the group consisting of an o-quinonediazide compound, an aryldiazonium salt, a diaryliodonium salt and a triarylsulfonium salt.

Another object of the invention is to provide a positive photosensitive resin composition which is also excellent particularly in sensitivity.

Accordingly, in one embodiment, the component (B) is an o-quinonediazide compound.

In one embodiment, the o-quinonediazide compound is obtainable by condensation of an o-quinonediazidosulfonyl chloride with a hydroxy compound or an amino compound in the presence of a dehydrochlorinating catalyst.

In one embodiment, the positive photosensitive resin composition of the invention contains 3 to 100 parts by weight of the component (B) relative to 100 parts by weight of the component (A).

In a preferred embodiment, the positive resin composition of the invention contains 5 to 40 parts by weight of the component (B) relative to 100 parts by weight of the component (A).

Another object of the invention is to provide a method of forming relief patterns with good profile by using a positive photosensitive resin composition which is highly sensitive to i-line and has good storage stability.

Accordingly, the invention provides a method of forming a relief pattern, comprising a step of applying the positive photosensitive resin composition of the invention onto a substrate and drying it thereon to form a coating film, a step of exposing the coating film to i-line, a step of developing the exposed coating film, and a step of heating the developed coating.

Another object of the invention is to provide a highly reliable electronic part by incorporating therein polyimide patterns having high heat resistance and good mechanical properties.

Accordingly, the invention provides an electronic part containing the relief pattern formed by the method of the invention as a surface-protecting film or an interlayer insulating film.

DESCRIPTION OF THE PREFERRED EMBODIMENTS

Figure 1A:
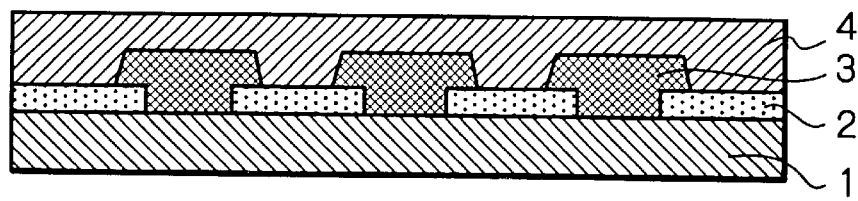
FIG. 1A to FIG. 1E show a process for fabricating a semiconductor device having a multi-layered interconnection structure.

In one embodiment, the invention provides a positive photosensitive resin composition to be used for i-line exposure. The component (A) used in the positive photosensitive resin composition for i-line exposure is a polyamidate having repetitive units of the general formula (I). As having phenolic hydroxyl groups, the polyamidate is soluble in aqueous alkaline solutions to be used as developers. On exposure, the exposed areas become more soluble in aqueous alkaline solutions due to the conversion of the component (B), and the difference in solution velocity between the exposed areas and the non-exposed areas makes the formation of a relief pattern possible. Aqueous alkaline solutions are aqueous solutions showing alkaline, for example, aqueous solutions of tetramethylammonium hydroxide, metal hydroxides or amines.

In general formula (I), the tetravalent organic group represented by $R^1$ is a residue obtainable by removing the carboxyl groups of a tetracarboxylic acid dianhydride which can react with diamines to form polyimide precursors, and it preferably involves 6 to 40 carbon atoms, more preferably involves one or more aromatic rings, such as benzene ring or naphthalene ring. In general formula (I), the positions of linkage of each set of the amide and ester bonds linked to the tetravalent organic group $R^1$ are preferably ortho or peri on an aromatic ring.

In general formula (I), the divalent organic group $R^2$ having a phenolic hydroxyl group is a residue obtainable by removing the amino groups of a phenolic hydroxyl group-having aromatic diamine compound which can react with tetracarboxylic acid dianhydride or derivatives to form polyimide precursors, and it preferably involves 6 to 40 carbon atoms. $R^2$ preferably involves one or more aromatic rings, such as one or more benzene rings or naphthalene rings.

Preferably, two amide bonds linked to $R^2$ are directly linked to each other either to the same aromatic ring or to different aromatic rings. $R^2$ preferably has 1 to 8 phenolic hydroxyl groups.

In this specification, aromatic rings may have one or more substituents in stead of the hydrogen atoms thereon.

In view of its stability and the mechanical properties and heat resistance of the polyimide polymers formed by heat treatment, $R^1$ is more preferably a tetravalent organic group which has a condensed polycyclic structure consisting of 2 to 5 benzene rings or a polycyclic structure wherein two or three aromatic rings are linked through one or two bonds selected from the group consisting of a single bond, an ether bond, a isopropylidene bond, a hexafluoroisopropylidene bond, a sulfone bond, a methylene bond and a carbonyl bond. Typical examples of $R^1$ include

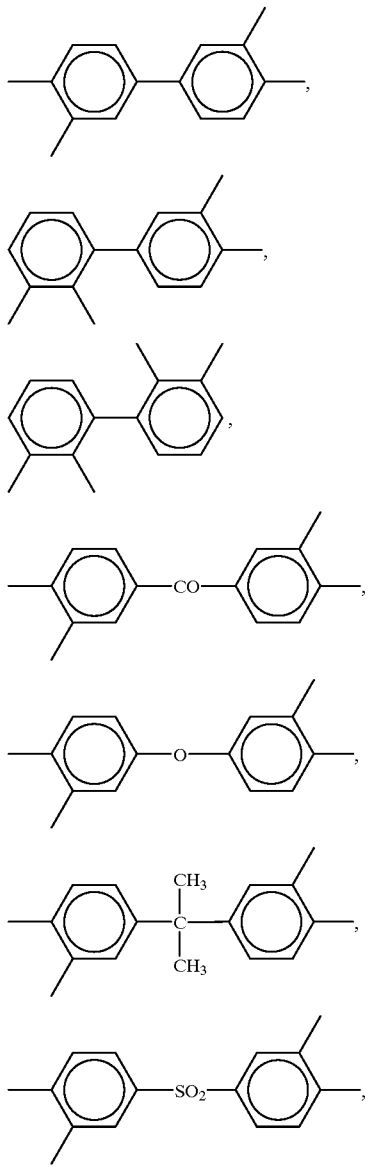

-continued

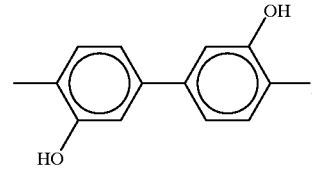

The group —C(=O)OC(R³)₃ is preferably linked to R¹ at an ortho or peri position relative to one of the amide bonds, and the group —C(=O)OC(R⁴)₃ is preferably linked to R¹ at an ortho or pert position relative to the other amide bond;

In view of the mechanical properties and heat resistance of the polyimide polymers formed by heat treatment, R² in general formula (I) is more preferably a divalent organic group which has an aromatic ring or a polycyclic structure wherein two or three aromatic rings are linked to each other through one or two bonds selected from the group consisting of a single bond, an ether bond, an isopropylidene bond, a hexafluoroisopropylidene bond, a sulfone bond, a methylene bond and a carbonyl bond, and has at least one phenolic hydroxyl group. Typical examples of R² are

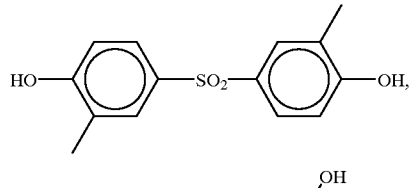

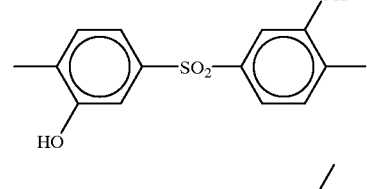

Preferred examples of alkyl groups for groups R³ and R⁴ in general formula (I) are alkyl groups of 1 to 20 carbon atoms, more preferably alkyl groups of 1 to 8 carbon atoms. Three R³ groups and three R⁴ groups in general formula (I) may be identical with or different from each other.

The polyamidate having the repetitive units of general formula (I) may further have repetitive units of general formula (II)

(II)

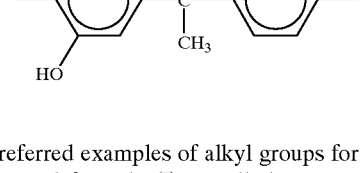

wherein $R^1$, $R^3$ and $R^4$ are as defined above for general formula (I), and $R^5$ is a divalent organic group having no phenolic hydroxyl group.

The divalent organic group $R^5$ having no phenolic hydroxyl group is a residue obtainable by removing the amino groups of a diamine compound which can react with tetracarboxylic acid dianhydrides or derivatives to form polyimide precursors, and it preferably involves 6 to 40 carbon atoms. $R^5$ preferably involves one or more aromatic rings, such as one or more benzene rings or naphthalene rings. Preferably, two amide bonds linked to $R^5$ are directly linked either to the same aromatic ring or to different aromatic rings.

In view of the mechanical properties and heat resistance of the polyimide polymers formed by heat treatment, $R^5$ in general formula (II) is more preferably a divalent organic group which has an aromatic ring or a polycyclic structure wherein two or three aromatic rings are linked to each other through one or two bonds selected from the group consisting of a single bond, an ether bond, an isopropylidene bond, a hexafluoroisopropylidene bond, a sulfone bond, a methylene bond and a carbonyl bond.

The polyamidate having repetitive units of general formula (I) may further have optional repetitive units other than the repetitive units of general formulas (I) and (II). Examples of such other repetitive units have the same structure as of general formulas (I) or (II) except that one or both of the ester groups (—COO—C($R^3$)$_3$ and —COO—C($R^4$)$_3$) linked to $R^1$ are replaced with carboxyl groups (—COOH).

Where the polyamidate has the repetitive units of general formulas (I) and (II), the ratio of the number m of the repetitive units of general formula (I) to the number n of the repetitive units of general formula (II) is preferably such that the ratio m/(m+n) falls between 1.0 and 0.2, more preferably between 1.0 and 0.4. If the ratio is less than 0.2, exposed areas of film formed by applying and drying the positive photosensitive resin composition may have poor solubility in aqueous alkaline solutions.

In such a polyamidate, the sum total of the numbers of the repetitive units of general formulas (I) and (II) is preferably 50 to 100%, more preferably 80 to 100%, particularly preferably 90 to 100%, based on all repetitive units of the polyamidate. Herein, one repetitive unit is comprised of one acid residue and one amine residue., The weight average molecular weight of the component (A) is preferably 3,000 to 200,000, more preferably 5,000 to 100,000. The weight average molecular weight is measured through gel permeation chromatography, based on conversion using the calibration curve of a standard polystyrene.

The polyamidate having the repetitive units of general formula (I) is obtainable by allowing a tetracarboxylic acid diester dichloride of the following general formula (III) to react with a diamine compound of the following general formula (IV) and, optionally, a diamine compound of the following general formula (V):

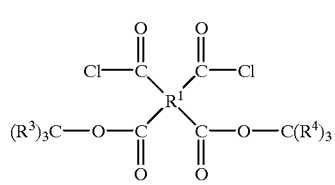

(III)

wherein $R^1$, $R^3$ and $R^4$ are as defined above, $$H_2N-R^2-NH_2 \quad (IV)$$

wherein $R^2$ is as defined above, $$H_2N-R^5-NH_2 \quad (V)$$

wherein $R^5$ is as defined above.

The tetracarboxylic acid diester dichloride of general formula (III) is obtainable by allowing a tetracarboxylic dianhydride of general formula (VI) to react with an alcohol compound of general-formula (VII), and then allowing the resulting tetracarboxylic acid diester of general formula (VIII) to react with thionyl chloride.

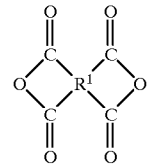

(VI)

wherein $R^1$ is as defined above;

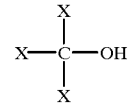

(VII)

wherein three X groups each independently are an alkyl group or a hydrogen atom and provide $R^3$ and $R^4$ in general formula (I), and at least two X groups are alkyl groups;

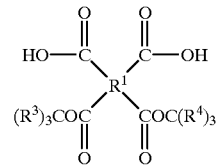

(VIII)

wherein $R^1$, $R^3$ and $R^4$ are as defined above.

The compounds of general formula (VI) are tetracarboxylic dianhydrides, and, in view of the storage stability of the positive photosensitive resin composition and the heat resistance and mechanical properties of polyimide polymers obtainable by heat treatment, preferred are carboxylic dianhydrides which involve a condensed polycyclic structure consisting of 2 to 5 benzene rings or a polycyclic structure wherein two or three aromatic rings are linked to each other through one or two bonds selected from the group consisting of a single bond, an ether bond, an isopropylidene bond, a hexafluoroisopropylidene bond, a sulfone bond, a methylene bond and a carbonyl bond. Examples of such compounds include 3,3',4,4'-biphenyltetracarboxylic dianhydride, 2,3,3',4'-biphenyltetracarboxylic dianhydride, 2,2',3,3'-biphenyltetracarboxylic dianhydride, 3,3',4,4'-benzophenonetetracarboxylic dianhydride, 3,3',4,4'-diphenylether-tetracarboxylic dianhydride, 3,3',4,4'-diphenyl sulfone tetracarboxylic dianhydride, 1,2,5,6-naphthalenetetracarboxylic dianhydride, 2,3,6,7-naphthalenetetracarboxylic dianhydride, 1,4,5,8-naphthalenetetracarboxylic dianhydride, 3,4,9,10-perylenetetracarboxylic dianhydride and 2,2-bis(3,4-dicarboxyphenyl)hexafluoropropane dianhydride.

According to the invention, those tetracarboxylic dianhydrides may be used individually or in combination of two or more.

Examples of the alcohol compounds of general formula (VII) include 2-propanol, 2-butanol, tert-butyl alcohol, 2-pentanol, 2-methyl-2-butanol, 3-methyl-2-butanol, 2-hexanol, 2-methyl-2-pentanol, 2,3-dimethyl-2-pentanol, 2,4-dimethyl-2-pentanol, 3-methyl-3-pentanol, 2,3-dimethyl-2-butanol and 3,3-dimethyl-2-butanol, and these may be used individually or in combination of two or more.

Examples of the compounds of general formula (IV) are diamines having at least one phenolic hydroxyl group, and, in view of the heat resistance and mechanical properties of polyimide polymers obtainable by heat treatment, preferred are diamines which involve an aromatic ring or a polycyclic structure wherein two or three aromatic rings are linked to each other through one or two bonds selected from the group consisting of a single bond, an ether bond, an isopropylidene bond, a hexafluoroisopropylidene bond, a sulfone bond, a methylene bond and a carbonyl bond. Examples of such diamines include 1,3-diamino-4-hydroxybenzene, 1,3-diamino-5-hydroxybenzene, 3,3'-diamino-4,4'-dihydroxybiphenyl, 4,4'-diamino-3,3'-dihydroxybiphenyl, bis(3-amino-4-hydroxyphenyl) sulfone, bis(4-amino-3-hydroxyphenyl) sulfone, bis(3-amino-4-hydroxyphenyl) hexafluoropropane, bis(4-amino-3-hydroxyphenyl) hexafluoropropane, 2,2-bis(3-amino-4-hydroxyphenyl) propane and 2,2-bis(4-amino-3-hydroxyphenyl)propane. These diamine compounds having at least one phenolic hydroxyl group may be used individually or in combination of two or more.

The compounds of general formula (V) are diamines, and, in view of the heat resistance and mechanical properties of polyimide polymers obtainable by heat treatment, preferred are diamines which involve an aromatic ring or a polycyclic structure wherein two or three aromatic rings are linked to each other through one or two bonds selected from the group consisting of a single bond, an ether bond, an isopropylidene bond, a hexafluoroisopropylidene bond, a sulfone bond, a methylene bond and a carbonyl bond. Examples of such compounds include 4,4'-diaminodiphenyl ether, 4,4'-diaminodiphenylmethane, 4,4'-diaminodiphenyl sulfone, benzidine, m-phenylenediamine, p-phenylenediamine, 1,5-naphthalenediamine, 2,6-naphthalenediamine, bis(3'-aminophenoxy-4-phenyl) sulfone, 1,4-bis(4-aminophenoxy) benzene and 4,4'-diamino-2,2'-dimethylbiphenyl. These diamine compounds may be used individually or in combination of two or more.

The tetracarboxylic acid diester compounds of general formula (VIII) may be synthesized through known methods, for example, by mixing a tetracarboxylic dianhydride of general formula (VI) and an excess alcohol compound of general formula (VII), allowing them to react by heating, and then removing residual alcohol compound. Preferred molar ratio of the tetracarboxylic dianhydride of general formula (VI) to the alcohol compound of general formula (VII) is 1/2 to 1/20, more preferably 1/2 to 1/10. Preferred reaction temperature is 20 to 130° C., and preferred reaction time is 3 to 240 hours. Basic catalysts may optionally be used.

The tetracarboxylic acid diester dichloride of general formula (III) may be synthesized by known methods, for example, by the reaction of the tetracarboxylic acid diester of general formula (VIII) with thionyl chloride. Preferred molar ratio of the tetracarboxylic acid diester to thionyl chloride is 1/1 to 1/10, more preferably 1/1.5 to 1/5. Preferred reaction temperature is −30° C. to 100° C., and preferred reaction time is 10 minutes to 10 hours. If thionyl chloride is used in excess relative to the tetracarboxylic acid diester, the excess thionyl chloride can be removed after completion of the reaction.

For example, the polyamidate is obtainable by dissolving diamine compounds of general formulas (IV) and (V) in an organic solvent, adding dropwise a solution of tetracarboxylic acid diester dichloride of general formula (III) in an organic solvent to carry out reaction, pouring the reaction mixture into a poor solvent, such as water, filtering the precipitate and drying it. When the diamine compounds of general formulas (IV) and (V) are dissolved in an organic solvent, a dehydrochlorinating agent, such as pyridine, may be added. Examples of organic solvents usable for the reaction are aprotic polar solvents, such as N-methyl-2-pyrrolidone, N,N-dimethylformamide, N,N-dimethylacetamide, dimethyl sulfoxide, hexamethyphosphoramide, tetramethylene sulfone and γ-butyrolactone, and these may be used individually or in combination of two or more.

The preferred molar ratio of sum total of the diamine compounds of general formula (IV) and (V) to the tetracarboxylic acid diester dichloride (III) is 0.6/1 to 1/0.6, as the ratio of the former/the latter. Preferred reaction temperature is −30° C. to 40° C., and preferred reaction time is 5 minutes to 10 hours.

In another embodiment, the invention provides a positive photosensitive resin composition the use of which is not limited to i-line exposure. The positive photosensitive resin composition contains, in stead of the component (A) which is a polyamidate having repetitive units of general formula (I), a component (A') which is a polyamidate having repetitive units of general formula (I'). The positive photosensitive resin composition is particularly highly sensitive to light, including i-line.

The definitions and examples of the groups represented by $R^1$, $R^3$ and $R^4$ in general formula (I') are the same as those for $R^1$, $R^3$ and $R^4$ in general formula (I).

In general formula (I'), the groups represented by —$C(R^3)_3$ and —$C(R^4)_3$ are preferably isopropyl groups, sec-butyl groups or 1-methylbutyl groups, to improve developability and to make developed films less shrinkable on heating.

In view of high sensitivity to lights such as i-line, the tetravalent organic group represented by $R^1$ in general formula (I') is particularly preferably selected from

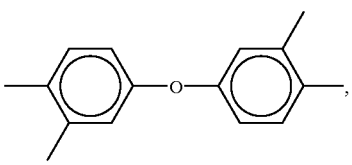,

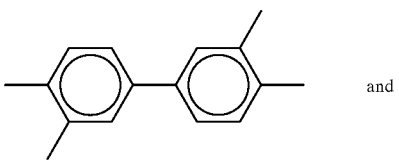 and

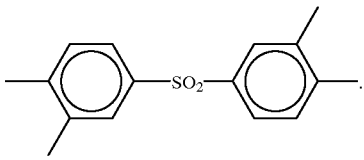

The polyamidate having the repetitive units of general formula (I') may further have the repetitive units of general formula (II) or the repetitive units of general formula (I) other than the repetitive units of general formula (I').

In the polyamidate having the repetitive units of general formula (I'), the ratio of the number x of the repetitive units of general formula (I') to the number y of other repetitive units is preferably such that the ratio x/(x+y) falls between 1.0 and 0.2, more preferably between 1.0 and 0.4. If the ratio is less than 0.2, exposed areas of film formed by applying and drying the positive photosensitive resin composition may have poor solubility in aqueous alkaline solutions.

The polyamidate having the repetitive units of general formula (I') may also has repetitive units which have the same structure as of general formulas (I') except that one or both of the ester groups (—COO—C($R^3$)$_3$ and —COO—C($R^4$)$_3$) linked to $R^1$ are replaced with carboxyl groups (—COOH).

In the polyamidate having the repetitive units of general formula (I'), the sum total of the numbers of the repetitive units of general formulas (I) (including the repetitive units of general formula (I')) and (II) is preferably 50 to 100%, more preferably 80 to 100%, particularly preferably 90 to 100%, based on all repetitive units of the polyamidate.

The weight average molecular weight of the component (A') is preferably 3,000 to 200,000, more preferably 5,000 to 100,000. The weight average molecular weight is measured through gel permeation chromatography, based on conversion using the calibration curve of a standard polystyrene.

The polyamidate having the repetitive units of general formula (I') may be synthesized in the same manner as the synthesis of the polyamidate having the repetitive units of general formula (I) except that 2,2-bis(3-amino-4-hydroxyphenyl)hexafluoropropane or 2,2-bis(3-amino-4-hydroxyphenyl)propane is used as an essential diamine.

Preferred examples of the tetracarboxylic dianhydrides of general formula (VI) usable for the synthesis of the polyamidate having the repetitive units of general formula (I') are 3,3',4,4'-biphenyltetracarboxylic dianhydride, 3,3',4,4'-diphenylether-tetracarboxylic dianhydride and 3,3',4,4'-diphenylsulfone-tetracarboxylic dianhydride.

Preferred examples of the alcohol compounds usable for the synthesis of the polyamidate having the repetitive units of general formula (I') are 2-propanol, 2-butanol and 2-pentanol.

The component (B) to be used in the invention, namely the compound capable of generating an acid when exposed to light is a photosensitive agent, and, on exposure to light, it generates an acid, thereby increasing the solubility of the exposed areas of the positive photosensitive resin composition in aqueous alkaline solutions. Examples of the compound include o-quinonediazide compounds, aryldiazonium salts, diaryliodonium salts and triarylsulfonium salts. Non-limitative but preferred examples are o-quinonediazide compounds as having high sensitivity.

O-quinonediazide compounds are obtainable, for example, through condensation of an o-quinonediazidosulfonyl chloride with a hydroxy compound or an amino compound in the presence of a dehydrochlorinating catalyst.

Examples of the o-quinonediazidosulfonyl chloride include 1,2-benzoquinone-2-diazido-4-sulfonyl chloride, 1,2-naphthoquinone-2-diazido-5-sulfonyl chloride and 1,2-naphthoquinone-2-diazido-4-sulfonyl chloride.

Examples of the hydroxy compound include hydroquinone, resorcinol, pyrogallol, bisphenol A, bis(4-hydroxyphenyl)methane, 2,2-bis(4-hydroxyphenyl)hexafluoropropane, 2,3,4-trihydroxybenzophenone, 2,3,4,4'-tetrahydroxybenzophenone, 2,2',4,4'-tetrahydroxybenzophenone, 2,3,4,2',3'-pentahydroxybenzophenone, 2,3,4,3',4',5'-hexahydroxybenzophenone, bis(2,3,4-trihydroxyphenyl)methane, bis(2,3,4-trihydroxyphenyl)propane, 4b,5,9b,10-tetrahydro-1,3,6,8-tetrahydroxy-5,10-dimethylindeno[2,1-a]indene, tris(4-hydroxyphenyl)methane and 1,1,1-tris(4-hydroxyphenyl)ethane.

Examples of the amino compound include p-phenylenediamine, m-phenylenediamine, 4,4'-diaminodiphenyl ether, 4,4'-diaminodiphenylmethane, 4,4'-diaminodiphenyl sulfone, 4,4'-diaminodiphenyl sulfide, o-aminophenol, m-aminophenol, p-aminophenol, 3,3'-diamino-4,4'-dihydroxybiphenyl, 4,4'-diamino-3,3'-dihydroxybiphenyl, 2,2-bis(3-amino-4-hydroxyphenyl)propane, 2,2-bis(4-amino-3-hydroxyphenyl)propane, bis(3-amino-4-hydroxyphenyl) sulfone, bis(4-amino-3-hydroxyphenyl) sulfone, 2,2-bis(3-amino-4-hydroxyphenyl)hexafluoropropane and 2,2-bis(4-amino-3-hydroxyphenyl)hexafluoropropane.

The quantities of the o-quinonediazidosulfonyl chloride and the hydroxy compound and/or the amino compound are preferably such that the sum total of the hydroxy group and the amino group is from 0.5 to 1 equivalent, more preferably 0.7 to 1 equivalent per mole of the o-quinonediazidosulfonyl chloride. The molar ratio of the dehydrochlorinating catalyst to the o-quinonediazidosulfonyl chloride is preferably between 0.95/1 and 1/0.95. The reaction temperature is preferably 0 to 40° C., and the reaction time is preferably 1 to 10 hours.

Examples of the reaction solvent usable for the reaction of forming o-quinonediazide compounds include dioxane, acetone, methyl ethyl ketone, tetrahydrofuran, diethyl ether and N-methylpyrrolidone. Examples of the dehydrochlorinating catalyst include sodium carbonate, sodium hydroxide, sodium hydrogencarbonate, potassium carbonate, potassium hydroxide, trimethylamine, triethylamine and pyridine.

The quantity of the component (B) is preferably 3 to 100 parts by weight, more preferably 5 to 40 parts by weight, relative to 100 parts by weight of the component (A) or (A'), in view of the thickness of the developed films and of the sensitivity of the positive photosensitive resin composition.

The positive photosensitive resin composition of the invention may be prepared as a solution by dissolving the component (A) or (A') and the component (B) in a solvent.

Examples of the solvent include aprotic polar solvents such as N-methyl-2-pyrrolidone, N,N-dimethylformamide, N,N-dimethylacetamide, dimethyl sulfoxide, hexamethylphosphoramide, tetramethylene sulfone, γ-butyrolactone, cyclohexanone, cyclopentanone and propylene glycol methyl ether acetate, which may be used individually or in combination of two or more.

To improve the adhesiveness of cured film to substrates, the positive photosensitive resin composition of the invention may further contain, for example, organic silane compounds or aluminum chelate compounds.

Examples of the organic silane compounds include γ-aminopropyltrimethoxysilane, γ-aminopropyltriethoxysilane, vinyltriethoxysilane, γ-glycidoxypropyltriethoxysilane, γ-methacryloxypropyl-trimethoxysilane and ureidopropyltriethoxysilane.

Examples of the aluminum chelate compounds include tris(acetylacetonato)aluminum and acetylacetatoaluminum diisopropylate.

The positive photosensitive resin composition of the invention is applied onto a substrate, for example, a glass substrate, a semiconductor, an insulative metal oxide such as $TiO_2$ or $SiO_2$, or silicon nitride, by, for example, dipping, spraying, screen printing or spin coating, and then dried thereon by removing most of the solvent with heat, to form a coating film of the positive photosensitive resin composition. Drying is generally carried out in an oven or on a hot plate. The drying conditions depend on the components of the positive photosensitive resin composition. When a hot plate is used, the drying is carried out preferably at 60 to 140° C., more preferably 80 to 130° C., for 30 seconds to 10 minutes. At lower drying temperatures, the solvent may fail to vaporize sufficiently, and may contaminate applying apparatuses and exposing apparatuses. At higher drying temperatures, the o-quinonediazide compounds in the positive photosensitive resin composition may decompose during the drying.

Non-limitative but preferable thickness of the dried coating film is 1 to 50 μm, more preferably 2 to 40 μm, particularly preferably 4 to 30 μm, especially preferably 4 to 20 μm.

Subsequently, the coating film is irradiated with active rays, such as ultraviolet rays, visible rays or a radiation, through a mask, and the exposed areas are removed by using a developer, to give a positive relief pattern.

Exposure to i-line (i-line exposure) using an i-line stepper is preferable because the positive photosensitive resin composition of the invention is particularly suited to i-line exposure. Non-limitative but preferable exposure is 100 to 1,000 $mJ/cm^2$.

The development is carried out by using a developer, preferably an alkaline developer, such as an at most 5% by weight, preferably 0.5 to 3.0% by weight concentration aqueous solution of sodium hydroxide, potassium hydroxide, sodium silicate or tetramethylammonium hydroxide, with a 1.5 to 3.0% by weight concentration aqueous solution of tetramethylammonium hydroxide particularly preferred.

Additives, such as alcohols or surfactants may be added to the developer. The quantity of each additive is preferably 0.01 to 10 parts by weight, more preferably 0.1 to 5 parts by weight, relative to 100 parts by weight of the developer.

After development, the developed pattern is preferably stabilized by rinsing it with water or a poor solvent and then optionally drying at around 100° C.

Subsequently, the developed pattern is heated preferably at 150 to 450° C., more preferably 200 to 400° C. to form a relief pattern of a heat-resistant polymer having imide rings and other optional cyclic groups. The heating time is preferably 0.05 to 10 hours, more preferably 0.1 to 3 hours. The heating is preferably carried out in an inert atmosphere, such as nitrogen.

The positive photosensitive resin composition of the invention may be used in electronic parts such as semiconductor devices or multilayer wiring boards. For example, it may be used for forming. surface-protecting films or interlayer insulating films in semiconductor devices, or for forming interlayer insulating films in multilayer wiring boards.

FIG. 1A to FIG. 1E show a process for fabricating a semiconductor device having a multi-layered interconnection structure. As illustrated, the semiconductor substrate 1 of, for example, Si, which has a circuit element thereon, is coated with the protective film 2 of, for example, silicon oxide, except for the predetermined parts of the circuit element, and the first conductor layer 3 is formed on the exposed circuit element. The semiconductor substrate is coated with the interlayer insulating film 4 of, for example, a polyimide resin, by spin-coating or the like (step of FIG. 1A).

Figure 1B:
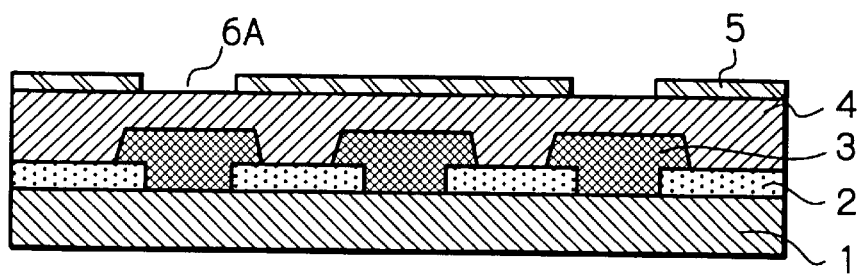
Figure 1C:
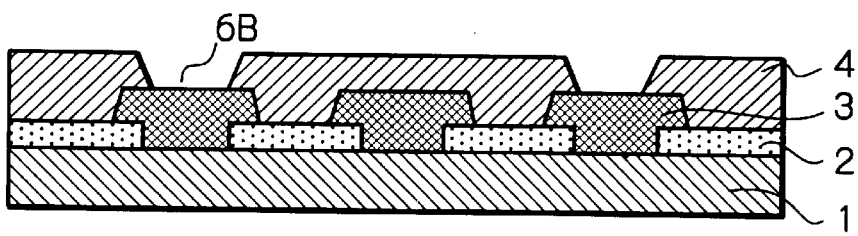

Next, the rubber chloride-based or phenol-novolak-based, photosensitive resin layer 5 is formed on the interlayer insulating film 4 by spin-coating, and the windows 6A are formed, through which predetermined parts of the interlayer insulating film 4 is exposed outside, by a known photo-engraving technique (step of FIG. 1B).

The interlayer insulating film 4 below each window 6A is selectively etched by a dry etching method using a gas such as oxygen or carbon tetrafluoride, to open the windows 6B. Next, the photosensitive resin layer 5 is completely removed with an etching solution capable of etching the photosensitive resin layer 5 only, but not etching the first conductor layer 3 exposed outside through the windows 6B (step of FIG. 1C).

Figure 1D:
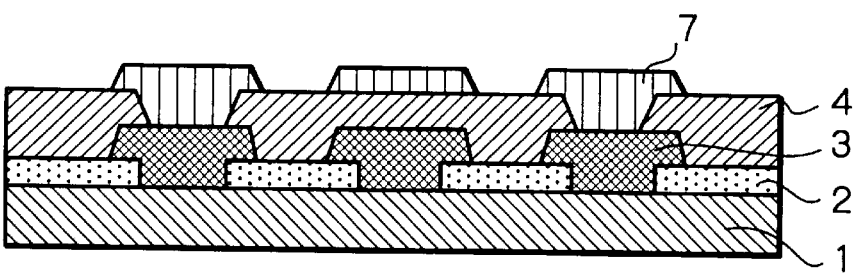

Next, by a known photo-engraving technique, the second conductor layer 7 is formed, which is completely electrically connected with the first conductor layer 3 (step of FIG. 1D).

To form a multi-layered interconnection structure having three or more layers, the steps illustrated are repeated for each layer.

Figure 1E:
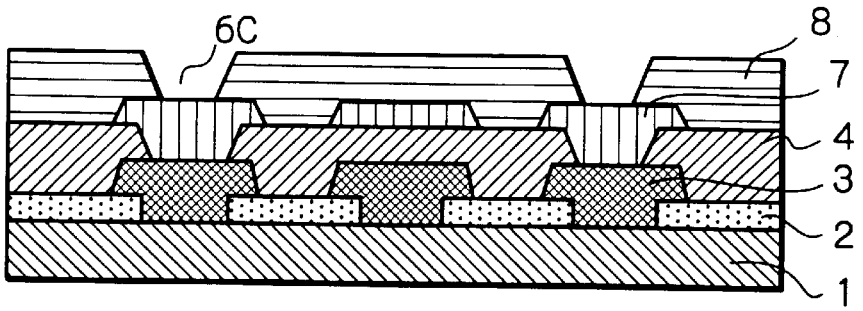

Next, the surface-protecting film 8 is formed (step of FIG. 1E). In this example illustrated, the surface-protecting film 8 is formed by applying the positive photosensitive resin composition of the invention onto the wafer by spin-coating, drying it thereon, exposing it to light via a mask having a pattern for the windows 6C to be formed in predetermined parts, developing it with an aqueous alkaline solution to give a predetermined pattern, and then heating the pattern to form a polyimide film.

In the example illustrated, the interlayer insulating film 4 may also be formed directly from the positive photosensitive resin composition of the invention without forming the photosensitive resin layer 5.

The relief pattern of the polyimide film formed from the positive photosensitive resin protects the conductor layers from external stresses, such as water, foreign matters or insulates the interconnection of the predetermined areas of the conductor layers, and it contributes good reliability to the product semiconductor device because patterns of good profiles can be formed according to the invention.

EXAMPLES 1 AND 2 AND COMPARATIVE EXAMPLES 1 AND 2

Example 1

Into a 0.5-liter flask equipped with a stirrer, a thermometer and a Dimroth condenser were added 23.54 g of 3,3',4,4'-biphenyltetracarboxylic dianhydride, 59.30 g of 2-butanol and 0.41 g of triethylamine, and reaction was carried out at 80° C. for 5 hours with stirring. Excess 2-butanol was distilled off under reduced pressure, to give di-sec-butyl 3,3',4,4'-biphenyltetracarboxylate. In the flask were then added 17.13 g of thionyl chloride and 70.00 g of toluene, and reaction was carried out at 40° C. for 3 hours. Toluene was removed under reduced pressure. 186 g of N-methyl-2-pyrrolidone was added thereto, to give a solution (α) of di-sec-butyl 3,3',4,4'-biphenyltetracarboxylate dichloride. In another 0.5-liter flask equipped with a stirrer, a thermometer and a Dimroth condenser was added 95 g of N-methyl-2-pyrrolidone (NMP), and 26.37 g of 2,2-bis(3-amino-4-hydroxyphenyl)hexafluoropropane was added thereto and dissolved with stirring. To the solution was added 22.78 g of pyridine, and the solution (α) of di-sec-butyl 3,3',4,4'-biphenyltetracarboxylate dichloride was added dropwise thereto over a period of 1 hour while the temperature was maintained to 0 to 5° C., and stirring was then continued for 1 hour. The reaction solution was poured into 4 liter of water, and the precipitate was collected, washed and dried under reduced pressure, to give a polyamidic acid sec-butyl ester (repetitive units: general formula (I), $R^1$: 3,3',4,4'-biphenyltetrayl; $R^3$ groups: H, —$CH_3$ and —$C_2H_5$; $R^4$ groups: H, —$CH_3$ and —$C_2H_5$; $R^2$:

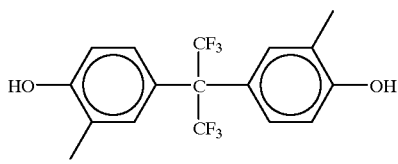

Hereinafter, the polymer will be called Polymer I. Polymer I had a weight average molecular weight of 19,200 (as measured by gel-permeation chromatography and converted based on the calibration curve of a standard, polystyrene).

An o-quinonediazide compound (1) of the following structure was prepared by allowing tris(4-hydroxyphenyl)methane and 1,2-naphthoquinone-2-diazido-5-sulfonyl chloride to react in a molar ratio of 1/3.

(1):

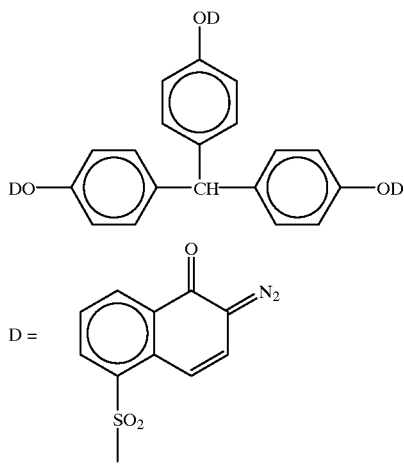

30.00 g of Polymer I and 4.50 g of the o-quinonediazide compound (1) were dissolved in 54.00 g of NMP with stirring. The solution was filtered under increased pressure through a Teflon filter with 3 μm pores to obtain a solution of a positive photosensitive resin composition.

The solution of the positive photosensitive resin composition was applied onto a silicon wafer by spin-coating using a spinner, and dried with heat on a hot plate at 100° C. for 3 minutes, to form a 7.7 μm film of the positive photosensitive resin composition. The coating film was exposed to i-line of 600 mJ/cm² through a mask by using an i-line reduction injection aligner (LD-5010i, produced by Hitachi, Ltd.). The exposed film was developed with a developer, a 2.38 wt % aqueous tetramethylammonium hydroxide solution, for 100 seconds, using a paddle, and rinsed with pure water, to form a relief pattern. After the development, the relief pattern was 7.0 μm thick. The relief pattern was then heated under nitrogen at 350° C. for 1 hour to obtain a polyimide film pattern of 4.4 μm thick.

The solution of the positive photosensitive resin composition was stored at 23° C. for 7 days, and then exposed and developed in the same manner as above, to form a relief pattern. After drying, the coating film was 7.7 μm thick, and, after development, 7.0 μm thick, showing no change in the percentage of film remaining after development.

Example 2

Into a 0.5-liter flask equipped with a stirrer, a thermometer and a Dimroth condenser were added 24.82 g of 3,3',4,4'-diphenylether-tetracarboxylic dianhydride, 48.08 g of 2-propanol and 0.41 g of triethylamine, and reaction was carried out at 80° C. for 5 hours with stirring. Excess 2-propanol was distilled off under reduced pressure, to give di-isopropyl 3,3',4,4'-diphenylether-tetracarboxylate. In the flask were then added 17.13 g of thionyl chloride and 70.00 g of toluene, and reaction was carried out at 40° C. for 3 hours. Toluene was removed under reduced pressure. 186 g of N-methyl-2-pyrrolidone was added thereto, to give a solution (β) of di-isopropyl 3,3',4,4'-diphenylether-tetracarboxylate dichloride. In another 0.5-liter flask equipped with a stirrer, a thermometer and a Dimroth condenser was added 95 g of N-methyl-2-pyrrolidone, and 26.37 g of 2,2-bis(3-amino-4-hydroxyphenyl)hexafluoropropane was added thereto and dissolved with stirring. To the solution was added 22.78 g of pyridine, and the solution (β) of di-isopropyl 3,3',4,4'-diphenylether-tetracarboxylate dichloride was added dropwise thereto over a period of 1 hour while the temperature was maintained to 0 to 5° C., and stirring was then continued for 1 hour. The reaction solution was poured into 4 liter of water, and the precipitate was collected, washed and dried under reduced pressure, to give a polyamidic acid isopropyl ester (repetitive units: general formula (I), $R^1$: 3,3',4,4'-phenoxybenzenetetrayl; $R^3$ groups: H, —$CH_3$ and —$CH_3$; $R^4$ groups: H, —$CH_3$ and —$CH_3$; $R^2$:

$R^2$:

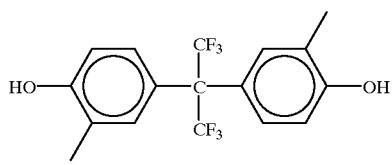

Hereinafter, the polymer will be called Polymer II. Polymer II had a weight average molecular weight of 23,700 (as measured by gel-permeation chromatography and converted based on the calibration curve of a standard, polystyrene).

An o-quinonediazide compound (2) of the following structure was prepared by allowing tris(4-hydroxyphenyl)methane and 1,2-naphthoquinone-2-diazido-4-sulfonyl chloride to react in a molar ratio of 1/2.9.

(2):

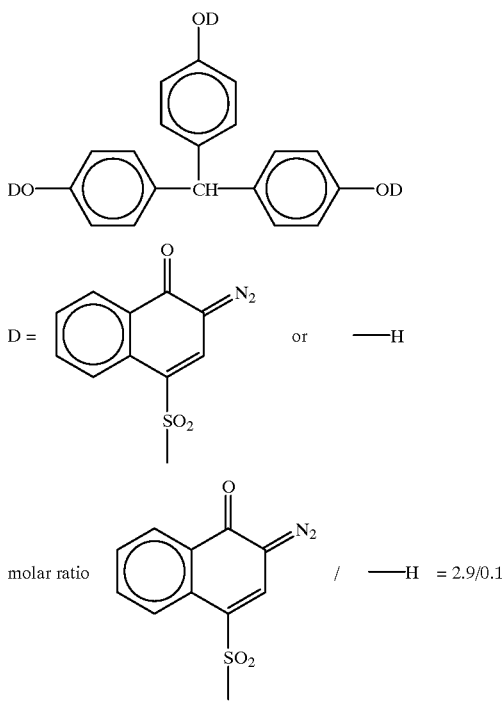

30.00 g of Polymer II and 4.50 g of the o-quinonediazide compound (2) were dissolved in 54.00 g of NMP with stirring. The solution was filtered under increased pressure through a Teflon filter with 3 μm pores to obtain a solution of a positive photosensitive resin composition.

The solution of the positive photosensitive resin composition was applied onto a silicon wafer by spin-coating using a spinner, and dried with heat on a hot plate at 100° C. for 3 minutes, to form a 8.7 μm film of the positive photosensitive resin composition. The coating film was exposed to i-line of 500 mJ/cm² through a mask by using an i-line reduction injection aligner (LD-5010i, produced by Hitachi, Ltd.). The exposed film was developed with a developer, a 2.38 wt % aqueous tetramethylammonium hydroxide solution, for 70 seconds, using a paddle, and rinsed with pure water, to form a relief pattern. After the development, the relief pattern was 6.5 μm thick. The relief pattern was then heated under nitrogen at 350° C. for 1 hour to obtain a polyimide film pattern of 4.29 μm thick.

The solution of the positive photosensitive resin composition was stored at 23° C. for 7 days, and then exposed and developed in the same manner as above, to form a relief pattern. After drying, the coating film was 8.7 μm thick, and, after development, 6.5 μm thick, showing no change in the percentage of film remaining after development.

Comparative Example 1

Into a 0.5-liter flask equipped with a stirrer, a thermometer and a Dimroth condenser were added 24.82 g of 3,3',4,4'-diphenylether-tetracarboxylic dianhydride, 59.30 g of n-butyl alcohol and 0.41 g of triethylamine, and reaction was carried out at 80° C. for 5 hours with stirring. Excess n-butyl alcohol was distilled off under reduced pressure, to give di-n-butyl 3,3',4,4'-diphenylether-tetracarboxylate. In the flask were then added 17.13 g of thionyl chloride and 70.00 g of toluene, and reaction was carried out at 40° C. for 3 hours. Toluene was removed under reduced pressure. 186 g of N-methyl-2-pyrrolidone was added thereto, to give a solution (γ) of di-n-butyl 3,3',4,4'-diphenylether-tetracarboxylate dichloride. In another 0.5 liter flask equipped with a stirrer, a thermometer and a Dimroth condenser was added 95 g of N-methyl-2-pyrrolidone, and 7.30 g of 3,5-diaminobenzoic acid and 4.81 g of 4,4'-diaminodiphenyl ether were added thereto and dissolved with stirring. To the solution was added 22.78 g of pyridine, and the solution (γ) of di-n-butyl 3,3',4,4'-diphenylether-tetracarboxylate dichloride was added dropwise thereto over a period of 1 hour while the temperature was maintained to 0 to 5° C., and stirring was then continued for 1 hour. The reaction solution was poured into 4 liter of water, and the precipitate was collected, washed and dried under reduced pressure, to give a polyamidic acid n-butyl ester. Hereinafter, the polymer will be called Polymer III. Polymer III had a weight average molecular weight of 25,900.

An o-quinonediazide compound (3) of the following structure was prepared by allowing 2,3,4,4'-tetrahydroxybenzophenone and 1,2-naphthoquinone-2-diazido-5-sulfonyl chloride to react in a molar ratio of 1/3.

(3):

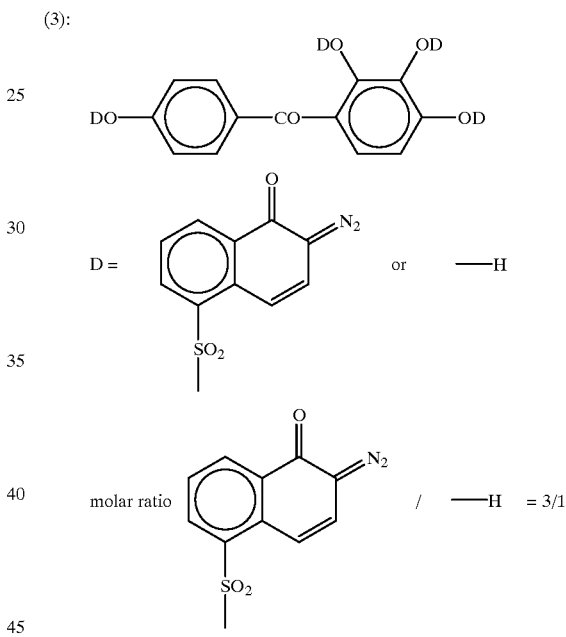

30.00 g of Polymer III and 3.00 g of the o-quinonediazide compound (3) were dissolved in 54.00 g of NMP with stirring. The solution was filtered under increased pressure through a Teflon filter with 3 μm pores to obtain a solution of a positive photosensitive resin composition.

The solution of the positive photosensitive resin composition was applied onto a silicon wafer by spin-coating using a spinner, and dried with heat. on a hot plate at 120° C. for 3 minutes, to form a 6.8 μm film of the positive photosensitive resin composition. The coating film was exposed to i-line of 1,000 mJ/cm² through a mask by using an i-line reduction injection aligner (LD-5010i, produced by Hitachi, Ltd.). The exposed film was developed with a developer, a 2.38 wt % aqueous tetramethylammonium hydroxide solution, for 70 seconds, using a paddle, and rinsed with pure water, to form a relief pattern. After the development, the relief pattern was 5.0 μm thick. The relief pattern was then heated under nitrogen at 350° C. for 1 hour to obtain a polyimide film pattern of 3.2 μm thick.

The solution of the positive photosensitive resin composition was stored at 23° C. for 7 days, and then exposed and developed in the same manner as above, to form a relief pattern. After drying, the coating film was 6.8 μm thick, and, after development, 1.2 μm thick, showing that the percentage of film remaining after development changed during storage.

Comparative Example 2

Into a 0.5-liter flask equipped with a stirrer, a thermometer and a Dimroth condenser were added 23.54 g of 3,3',4,4'-biphenyltetracarboxylic dianhydride, 59.30 g of n-butyl alcohol and 0.41 g of triethylamine, and reaction was carried out at 80° C. for 5 hours with stirring. Excess n-butyl alcohol was distilled off under reduced pressure, to give di-n-butyl 3,3',4,4'-biphenyltetracarboxylate. In the flask were then added 17.13 g of thionyl chloride and 70.00 g of toluene, and reaction was carried out at 40° C. for 3 hours. Toluene was removed under reduced pressure. 186 g of N-methyl-2-pyrrolidone was added thereto, to give a solution (δ) of di-n-butyl 3,3',4,4'-biphenyltetracarboxylate dichloride. In another 0.5-liter flask equipped with a stirrer, a thermometer and a Dimroth condenser was added 95 g of N-methyl-2-pyrrolidone, and 26.37 g of 2,2-bis(3-amino-4-hydroxyphenyl)hexafluoropropane was added thereto and dissolved with stirring. To the solution was added 22.78 g of pyridine, and the solution (δ) of di-n-butyl 3,3',4,4'-biphenyltetracarboxylate dichloride was added dropwise thereto over a period of 1 hour while the temperature was maintained to 0 to 5° C., and stirring was then continued for 1 hour. The reaction solution was poured into 4 liter of water, and the precipitate was collected, washed and dried under reduced pressure, to give a polyamidic acid n-butyl ester. Hereinafter, the polymer will be called Polymer IV. Polymer IV had a weight average molecular weight of 21,100.

30.00 g of Polymer IV and 6.00 g of the o-quinonediazide compound (2) prepared by allowing tris(4-hydroxyphenyl)methane and 1,2-naphthoquinone-2-diazido-4-sulfonyl chloride to react in a molar ratio of 1/2.9 were dissolved in 54.00 g of NMP with stirring. The solution was filtered under increased pressure through a Teflon filter with 3 μm pores to obtain a solution of a positive photosensitive resin composition.

The solution of the positive photosensitive resin composition was applied onto a silicon wafer by spin-coating using a spinner, and dried with heat on a hot plate at 115° C. for 3 minutes, to form a 7.7 μm film of the positive photosensitive resin composition. The coating film was exposed to i-line of 600 mJ/cm² through a mask by using an i-line reduction injection aligner (LD-5010i, produced by Hitachi, Ltd.). The exposed film was developed with a developer, a 2.38 wt % aqueous tetramethylammonium hydroxide solution, for 80 seconds, using a paddle, and rinsed with pure water, to form a relief pattern. After the development, the relief pattern was 6.9 μm thick. The relief pattern was then heated under nitrogen at 350° C. for 1 hour to obtain a polyimide film pattern of 4.1 μm thick.

The solution of the positive photosensitive resin composition was stored at 23° C. for 7 days, and then exposed and developed in the same manner as above, to form a relief pattern. After drying, the coating film was 7.7 μm thick, and, after development, 2.9 μm thick, showing that the percentage of film remaining after development was changed during storage.

The above Examples and Comparative Examples show that the positive photosensitive resin compositions of Examples were highly sensitive to i-line and had good storage stability, while those of Comparative Examples 1 and 2 were changed, by the 23° C.-storage, in the percentages of the films remaining after development.

What is claimed is:

1. A positive photosensitive resin composition comprising:

(A) a polyamidate having repetitive units of general formula (I) and being soluble in aqueous alkaline solution

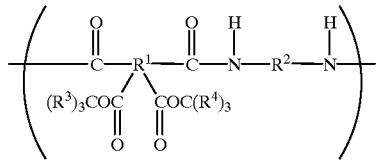

wherein $R^1$ is a tetravalent organic group which has a condensed polycyclic structure consisting of 2 to 5 benzene rings or a polycyclic structure wherein two or three aromatic rings are linked to each other through one or two bonds selected from the group consisting of a single bond, an ether bond, an isopropylidene bond, a hexafluoroisopropylidene bond, a sulfone bond, a methylene bond and a carbonyl bond, $R^2$ is a divalent organic group having a phenolic hydroxyl group, three $R^3$ groups and three $R^4$ groups each independently are an alkyl group or a hydrogen atom, and at least two $R^3$ groups and at least two $R^4$ groups and at least two $R^4$ groups are alkyl groups, and (B) a compound capable of generating an acid when exposed to light.

2. The positive photosensitive resin composition of claim 1, which is to be exposed to i-line.

3. The positive photosensitive resin composition of claim 1, wherein $R^2$ is a divalent organic group which has an aromatic ring or a polycyclic structure wherein two or three aromatic rings are linked to each other through one or two bonds selected from the group consisting of a single bond, an ether bond, an isopropylidene bond, a hexafluoroisopropylidene bond, a sulfone bond, a methylene bond and a carbonyl bond, and has at least one phenolic hydroxyl group.

4. The positive photosensitive resin composition of claim 3, wherein the tetravalent organic group represented by $R^1$ is selected from the group consisting of

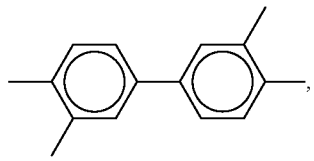

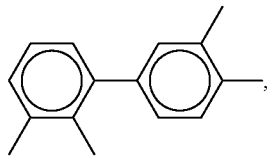

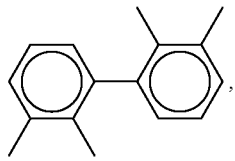

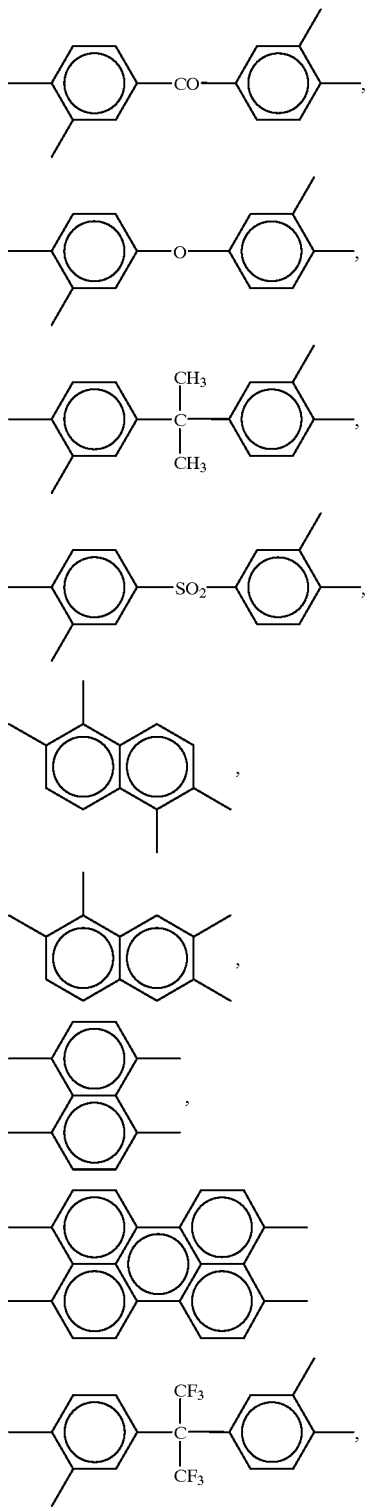

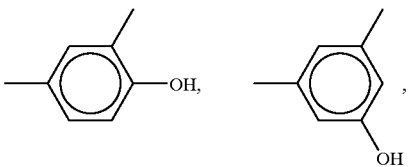

and the group —C(=O)OC(R³)₃ is linked to R¹ at an ortho or peri position relative to one of the amide bonds, and the group —C(=O)OC(R⁴)₃ is linked to R¹ at an ortho or peri position relative to the other amide bond;

and the divalent organic group represented by R² is selected from the group consisting of

5. The positive photosensitive resin composition of claim 1 which comprises (A') a polyamidate having repetitive units of general formula (I')

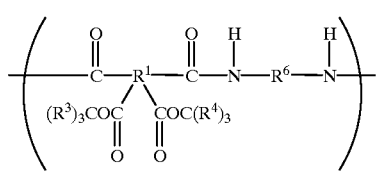
(I')

wherein R¹ is a tetravalent organic group, R⁶ is a divalent organic group selected from

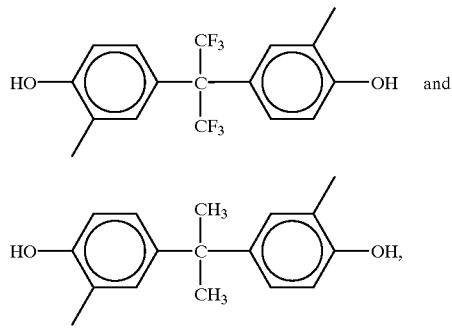

three R³ groups and three R⁴ groups each independently are an alkyl group or a hydrogen atom, and at least two R³ groups and at least two R⁴ groups are alkyl groups, and (B) a compound capable of generating an acid when exposed to light.

6. The positive photosensitive resin composition of claim 1, wherein —C(R³)₃ and —C(R⁴)₃ are isopropyl groups, sec-butyl groups or 1-methylbutyl groups.

7. The positive photosensitive resin composition of claim 1, wherein the tetravalent organic group represented by R¹ is selected from the group consisting of

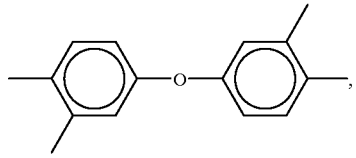

-continued

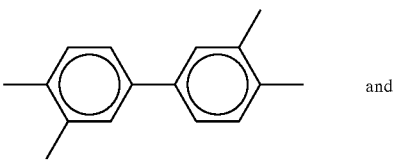 and

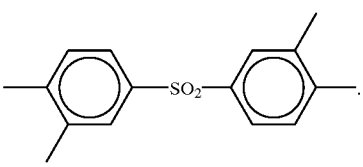.

8. The positive photosensitive resin composition of claim 1, wherein the component (B) is selected from the group consisting of an o-quinonediazide compound, an aryldiazonium salt, a diaryliodonium salt and a triarylsulfonium salt.

9. The positive photosensitive resin composition of claim 1, wherein the component (B) is an o-quinonediazide compound.

10. The positive photosensitive resin composition of claim 9, wherein the o-quinonediazide compound is obtainable by condensation of an o-quinonediazidosulfonyl chloride with a hydroxy compound or an amino compound in the presence of a dehydrochlorinating catalyst.

11. The positive photosensitive resin composition of claim 1, which contains 3 to 100 parts by weight of the component (B) relative to 100 parts by weight of the component (A).

12. The positive photosensitive resin composition of claim 11, which contains 5 to 40 parts by weight of the component (B) relative to 100 parts by weight of the component (A).

13. A method of forming a relief pattern, comprising a step of applying the positive photosensitive resin composition of claim 1 onto a substrate and drying it thereon to form a coating film, a step of exposing the coating film to i-line, a step of developing the exposed coating film, and a step of heating the developed coating film.

14. An electronic part containing the relief pattern formed by the method of claim 13 as a surface-protecting film or an interlayer insulating film.

* * * * *